US006462677B1

(12) United States Patent
Johnson et al.

(10) Patent No.: US 6,462,677 B1
(45) Date of Patent: Oct. 8, 2002

(54) ENCODER WITH EMBEDDED SIGNAL CIRCUITRY

(75) Inventors: David B. Johnson, South Ogden, UT (US); Dean B. Childs, Ogden, UT (US); James A. Elzey, Fruit Heights, UT (US); Timothy A. Tabor, West Jordan, UT (US)

(73) Assignee: Bourns, Inc., Riverside, CA (US)

( * ) Notice: Subject to any disclaimer, the term of this patent is extended or adjusted under 35 U.S.C. 154(b) by 0 days.

(21) Appl. No.: 09/567,847

(22) Filed: May 9, 2000

(51) Int. Cl.[7] .................................... H03M 1/22
(52) U.S. Cl. ......................... 341/16; 341/10; 200/11 R
(58) Field of Search ............................... 341/10, 6, 16, 341/20; 200/11 R, 4; 340/347

(56) References Cited

U.S. PATENT DOCUMENTS 4,166,200 A * 8/1979 Reichen et al. ........... 200/11 R
4,443,670 A 4/1984 Nakamura et al. ....... 200/11 DA
4,558,513 A * 12/1985 Buss ........................... 29/622
4,599,605 A 7/1986 Froeb et al. ............. 340/347 P
4,866,219 A * 9/1989 Riding et al. .................. 200/4
5,017,741 A 5/1991 Brown et al. ............... 174/260
5,153,391 A * 10/1992 Dzung et al. ............. 200/11 R
5,739,775 A * 4/1998 Brandestini .................. 341/10

* cited by examiner

*Primary Examiner*—Brian Young
*Assistant Examiner*—John Nguyen
(74) *Attorney, Agent, or Firm*—Howard J. Klein

(57) ABSTRACT

An integrated digital electronic encoder that converts mechanical movement of a device input into a signal that can be applied to particular purposes is described. The encoder and associated signal conditioning and processing circuitry are embedded together as a single unit for simplicity of assembly into particular applications, and reliability. The integrated digital electronic encoder includes a substrate with first and second substantially opposed major surfaces, and a digital encoder formed on the first major surface of the substrate. The encoder comprises an actuation shaft, and the encoder is configured to generate electrical signals in response to movement of the actuation shaft. Electronic circuitry is attached to the second major surface of the substrate, preferably using surface mount technology. The electronic circuitry is electrically connected with the digital encoder to process the signals produced by the encoder. The electronic circuitry includes programmable logic to provide multiple function capability to the integrated digital encoder. The electronic circuitry also includes supervisory power circuitry for conditioning the power supplied to the programmable logic, and output circuitry such as a communication interface.

22 Claims, 4 Drawing Sheets

PIC16F872
MAX232A
OEM INCREMENTAL
OEM PIN-5
LM3480
+5V@100ma
MCLR/VPP
OSC1/CLKIN
OSC2/CLKOUT
RB7/PGD
RB6PGC
RB0/INT
TX
RX
COM
V+
GND
VCC
TPAD
27
25
51
53
55
61
63

ENCODER WITH EMBEDDED SIGNAL CIRCUITRY

FIELD OF THE INVENTION

The present invention relates to electrical encoders that convert angular or linear mechanical movement or position to a digital electrical output.

BACKGROUND OF THE INVENTION

Various schemes exist to convert angular or linear mechanical position to a digital output. The simplest converters are potentiometers, which convert position to an output voltage by acting as a resistive divider. The analog output from a potentiometer can then be converted to a digital format, if required. A multiposition switch may be used to generate an output signal that consists of discrete steps.

More recently, digital incremental encoders have emerged to be used with microprocessor based equipment. A typical digital encoder includes one or more tracks and sensors arranged to produce a pair of square wave patterns with a 90-degree phase shift.

Electrical encoders are well known in the art, as exemplified by the rotary encoder described in U.S. Pat. No. 4,599,605 to Froeb et al. Such devices typically include a housing that encloses a substrate having a conductive pattern formed a thereon to define a preselected digital signal, in the form of a pulse train or the like. A rotor, rotated by a shaft, carries a rotating element that electrically interconnects with the conductive pattern as the rotor is rotated to generate an electrical signal having the digital characteristics defined by the conductive pattern on the substrate. For example, the rotor may carry a rotating contact element that mechanically contacts the conductive pattern as the rotor is rotated, to generate the electrical signal. In other encoders, a non-contacting rotor is used. Non-contacting rotors may, for example, be magnetic, optical, or capacitive.

Some encoders convert linear movement into the preselected digital signal using a slider rather than a rotor, as also understood by those skilled in the art.

SUMMARY OF THE INVENTION

The present invention converts mechanical movement of a device input into a signal that can be applied to particular purposes. In accordance with the present invention, the encoder and associated signal conditioning and processing circuitry are embedded together as a single unit for simplicity of assembly into particular applications, and for reliability.

The present invention is an integrated digital electronic encoder that includes a substrate with first and second substantially opposed major surfaces, and a digital encoder formed on the first major surface of the substrate. The encoder comprises an actuation shaft, and the encoder is configured to generate electrical signals in response to movement of the actuation shaft. Electronic circuitry is attached to the second major surface of the substrate, preferably using surface mount technology. The electronic circuitry is electrically connected with the digital encoder to process the signals produced by the encoder, and preferably includes programmable logic.

DETAILED DESCRIPTION OF A PREFERRED EMBODIMENT

Figure 1:
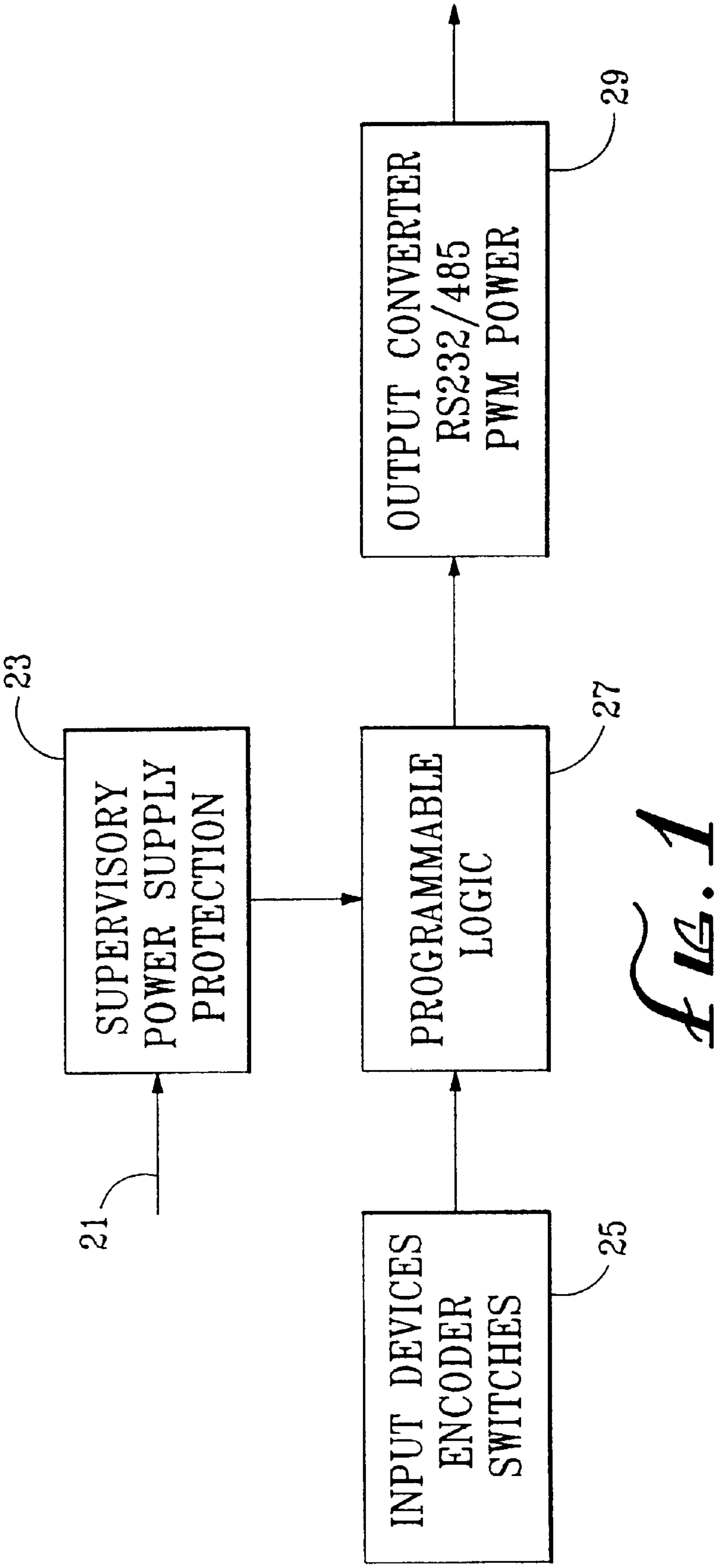
FIG. 1 is a block diagram of an encoder with embedded circuitry constructed in accordance with the present invention.

Referring first to FIG. 1, a particular embodiment of the integrated encoder device constructed in accordance with the present invention is shown in functional block diagram form. The integrated encoder device receives input power through a power input 21 to a supervisory power supply protection component 23. The supervisory power supply protection component 23 may comprise several discrete elements that regulate the power to provide a stable, clean power source; filter the power to remove high frequency noise and protect other elements of the electronic circuitry from voltage spikes; and provide a reset function to ensure proper start-up of the other elements of the circuitry.

An input device 25 provides functional input for the integrated device constructed in accordance with the present invention. In particular, the preferred input device is a digital encoder. The digital encoder produces encoder signals in accordance with its design, as is well understood by those familiar with the art. For example, either a 2-bit or 8-bit gray code encoder may be used.

Programmable logic 27 receives power from the supervisory power supply protection component 23, and encoder signals from the digital encoder input device 25. The programmable logic 27 performs signal conditioning and signal processing functions on the encoder signals. The programmable logic is preferably programmable either by the device manufacturer, or by the manufacturer of equipment using the device, to perform functions that are appropriate for the application. The programmable logic may be one-time programmable, or may be repeatedly programmable. The logic may be a programmable microcontroller, such as a RISC-type controller. The programmable logic produces conditioned and processed signals appropriate for use by other, external devices.

An output function converter 29 provides an output interface for making the conditioned and processed signals generated by the programmable logic available for application to other devices.

In accordance with the present invention, an encoder that converts linear or rotational mechanical movement into digital electronic signals is formed as an integral unit with circuitry such as programmable logic that performs signal processing and other functions related to the operation of the encoder. Preferably, the programmable logic 27 is secured to the same electronic board or substrate as the encoder 25 itself.

Figure 2:
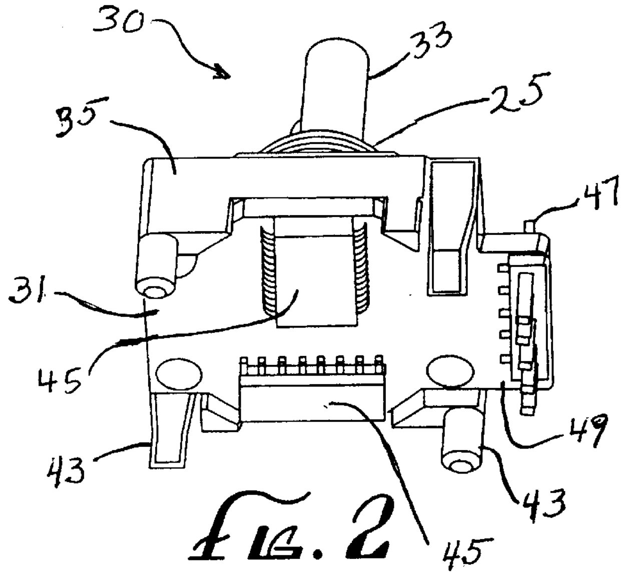
FIG. 2 is a perspective view of the lower side of an encoder with embedded circuitry constructed in accordance with the present invention.
Figure 3:
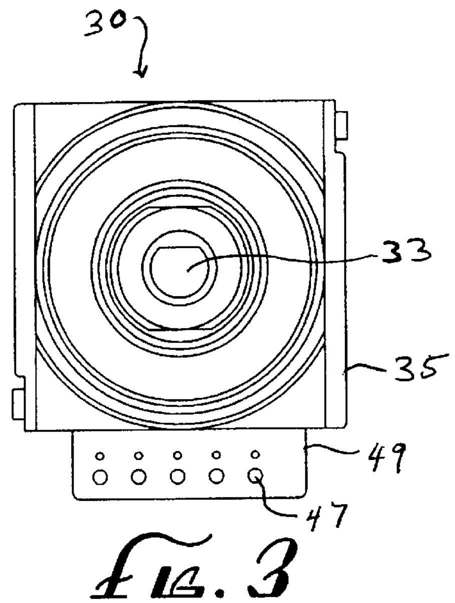
FIG. 3 is a top view of the encoder shown in FIG. 2.

A particular embodiment of an integrated encoder device 30 constructed in accordance with the present invention is shown in FIGS. 2 through 5. Referring first to FIG. 2 the integrated encoder device 30 is seen in a perspective view from its underside. The integrated encoder device 30 includes an encoder portion 25 mounted on a substrate 31 that comprises a circuit board having upper and lower major surfaces.

The circuit board substrate 31 is formed of conventional circuit board material, such as PCB FR-4, with multiple layers. The circuit board substrate 31 includes circuitry (not shown) on both major surfaces thereof, with the intermediate layer(s) (not shown) containing circuitry interconnecting the surface circuitry as appropriate for particular applications, in a manner known to those skilled in the art.

The upper major surface of the circuit board substrate 31 includes the encoder 25, while the lower major surface of the substrate 31 includes circuitry for converting the position and movement of the encoder 25 into predetermined electrical signals, generating encoder output signals. The circuitry for generating encoder output signals may be of substantially conventional design for an encoder, which will be familiar to those skilled in the art, and is not here shown in detail.

For example, the encoder 25 may be of any conventional type, well-known in the art. See, for example, U.S. Pat. No. 4,443,670—Nakamura et al. and U.S. Pat. No. 5,017,741—Brown et al., the disclosures of which are incorporated herein by reference. In accordance with these conventional designs, the encoder 25 typically includes a rotor (not shown) with a plurality of electrical contact fingers (not shown) attached to the lower surface of the rotor. The contact fingers make electrical contact with conductive elements (not shown) formed on the upper surface of the substrate. The conductive elements may include input and output rings. The contact fingers transfer electrical signals between the input and output rings. The conductive elements are formed in a pattern that results in a predetermined electrical signal being generated as the rotor is rotated. An actuation shaft 33 is attached to, and extends axially from, the rotor. The actuation shaft 33 permits user input (rotational and axial) to the encoder 25.

Those skilled in the art will recognize that various non-contacting encoder designs may also be applied to the upper surface of the substrate circuit board. Exemplary non-contacting encoder designs include magnetic, optical, or capacitive embodiments, which will be familiar to those skilled in the art.

Still referring to FIGS. 2 through 5, a housing 35 encloses the upper encoder portion 25 of the integrated encoder device 30. The housing 35 includes an upwardly extending hollow cylindrical fitting 37. The actuation shaft 33 of the encoder 25 extends through the hollow cylindrical fitting 37. The hollow cylindrical fitting 37 may be externally threaded so that the cylindrical fitting may be attached to a console or similar device mounting structure (not shown) that is formed with mating threads. The upper surface of the housing may also include an externally threaded portion 41, to provide an additional option for attaching the integrated encoder to a console or similar mounting structure.

Figure 4:
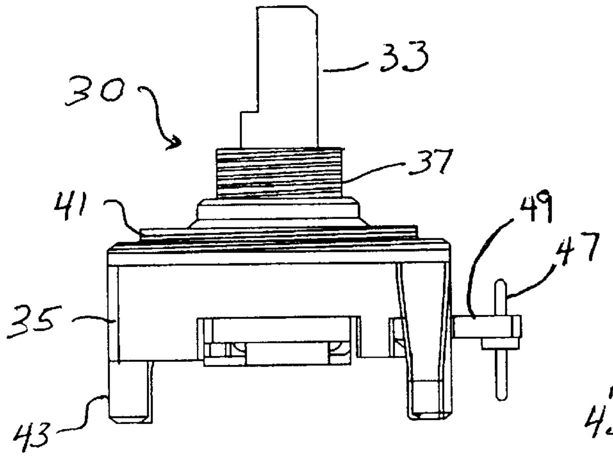
FIG. 4 is a side view of the encoder shown in FIG. 2.
Figure 5:
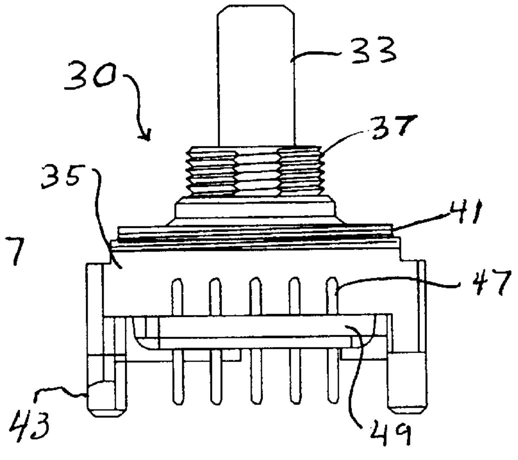
FIG. 5 is a front view of the encoder shown in FIG. 2.

Referring now to FIGS. 2, 4, and 5, the lower portion of the housing 35 includes downwardly extending mounting feet 43 that may be used in mounting the integrated encoder device 30 in particular applications. For example, the feet 43 may abut a mounting surface (not shown) to position the integrated encoder device 30 in its operating environment. In certain embodiments or implementations, openings (not shown) may be provided through the feet 43 to permit mounting screws or other attachment devices (not shown) to be inserted through the housing to secure the integrated encoder device 30 to a mounting structure.

Referring again to FIG. 2, one or more circuit elements 45 are mounted on the lower major surface of the substrate 31 (opposite the encoder mounting). The circuit elements 45 include the supervisory power supply protection 23, the programmable logic 27, and the output converter 29. Some elements may be mounted on the upper major surface of the substrate, alongside the encoder 25, provided the encoder pattern is uninterrupted. However, in the embodiment illustrated, the upper surface of the substrate encompasses only the encoder 25.

The programmable logic 27 may be any of a number of devices of types that are known to those skilled in the art. For example, the programmable logic may include an application specific integrated circuit (ASIC) containing circuitry for processing the signals generated by the encoder. Such circuitry may include circuitry for modifying or conditioning the encoder signal, such as signal filters. Such signal filters may include de-bounce circuitry familiar to those skilled in the art. The circuitry of the logic may also include signal modifiers to identify angle of rotation and direction of rotation of the shaft, or to detect the speed with which the encoder shaft is manipulated. The circuitry may also provide access to multiple functions in response to particular rotational or axial movement of the shaft. Additional functions may be provided to permit hardware or software keying of functions, to enable or disable embedded features and options. Furthermore, the programmable logic preferably includes memory for programming to accomplish specific tasks desired of the circuitry. The memory may be included on an integrated logic device, or may be a separate device. The memory may be one time programmable, or may be repeatedly programmable. Thus, the memory may include EPROM or EEPROM devices. In a particularly preferred embodiment, the logic is provided in a programmable microprocessor, such as a Reduced Instruction Set Controller (RISC-type) microprocessor with embedded memory. Alternatively, programmable logic arrays, and other programmable devices may be included.

Integrated into the programmable logic or microprocessor may be debounce circuitry analogous to the circuitry contained in a conventional MC 14490 device, application-specific decode logic, and other functions that have, prior to the current invention, been performed in discrete separate devices.

The programmable logic 27 may be programmed in such a manner that how the programmable logic interprets signals from the encoder 25 can be modified to provide a different output at the output converter 29 (FIG. 1) for a given input supplied by the encoder 25. An advantage of the integrated device 30 illustrated and described herein is that the programmable logic can be programmed so that it can be reprogrammed by manipulation of the actuation shaft 33 of the encoder 25 itself. For example, the programmable logic can be programmed so that, in certain modes of operation, the signals produced by the encoder 25 in response to particular manipulations of the actuation shaft 33 alter features of the programmable logic, such as selecting modes of operation, or adjusting particular performance characteristics of the signal processing functions.

The programmable logic or microprocessor 27 is preferably mounted on the lower major surface of the substrate 31 using surface mount technology. Surface mounting eliminates the protrusion of electrical pins through the substrate. Multilayer substrates with multiple layers of embedded electrical circuitry can be used in combination with such surface mount technology to permit the installation of electronic devices on both sides of the substrate board. The circuitry on the lower major surface of the circuit board substrate therefore includes surface mount pads (not shown). Thus, the encoder 25 and the programmable logic 27 may be mounted on the opposed major surfaces of a single circuit board substrate 31.

Additional electronic devices 45 may be attached to the lower major surface of the circuit board substrate 31. For example, if the supervisory power supply protection function and the output converter function are not integrated into the programmable logic 27, devices for performing those functions may be separately attached to the lower surface of the circuit board substrate.

The integrated digital encoder device 30 includes a plurality of input and output pins 47. The input and output pins 47 extend vertically from a horizontal extension 49 of one edge of the circuit board substrate 31. In the illustrated embodiment shown in FIGS. 2 through 5, the input and output pins 47 are elongate vertical metal cylinders that provide electrical connections to which a variety of external devices may be attached. Circuitry for conducting power and/or signals between and among the input and output pins 47, the programmable logic 27, the digital encoder 25, and other circuit elements 45 mounted on the circuit board substrate 31 may be applied to either surface major surface of the circuit board substrate, or may be embedded in an intermediate layer of the circuit board substrate. The formation of such circuitry on the circuit board substrate will be apparent to those skilled in the art. Those skilled in the art will also recognize that other forms of input and output contact points may be provided on the circuit board substrate.

Digital encoders are used in a variety of applications. One common application is the volume control for an audio device, such as a radio, in which the rotational position of the shaft 33 is converted into a particular volume level. In such an application, an absolute encoder may be most appropriate, wherein a particular rotational position of the shaft 33 is always associated with a particular signal, such as to designate a particular volume level. In many such applications, the shaft 33 may also function as the on/off switch for the audio device. For example, briefly depressing the shaft 33 axially turns the audio device on or off. In alternative applications, depressing the shaft 33 of the encoder 25 may produce different results in different circumstances. For example, depressing and shortly thereafter releasing the shaft 33 may function as an on/off switch or switch the device between different modes of operation, while holding the shaft in a depressed position for a longer period of time may access a menu of options that may be selected by the user. A single rotary control could therefore provide menu access to multiple functions, eliminating the need for multiple separate controls. For example, a single rotary control on an audio device can be programmed using the present invention to provide controls for treble and bass control, and for balance and fade, as well as power on/off and volume. The functions provided in response to the manipulation of the encoder shaft 33 are determined by the programmable logic included in the integrated encoder device 30.

In certain other applications, a relative encoder is appropriate. A relative encoder generates a signal indicating relative movement of the rotor shaft. Again, the functions provided are determined by the logic included in the integrated encoder device 30.

Figure 6:
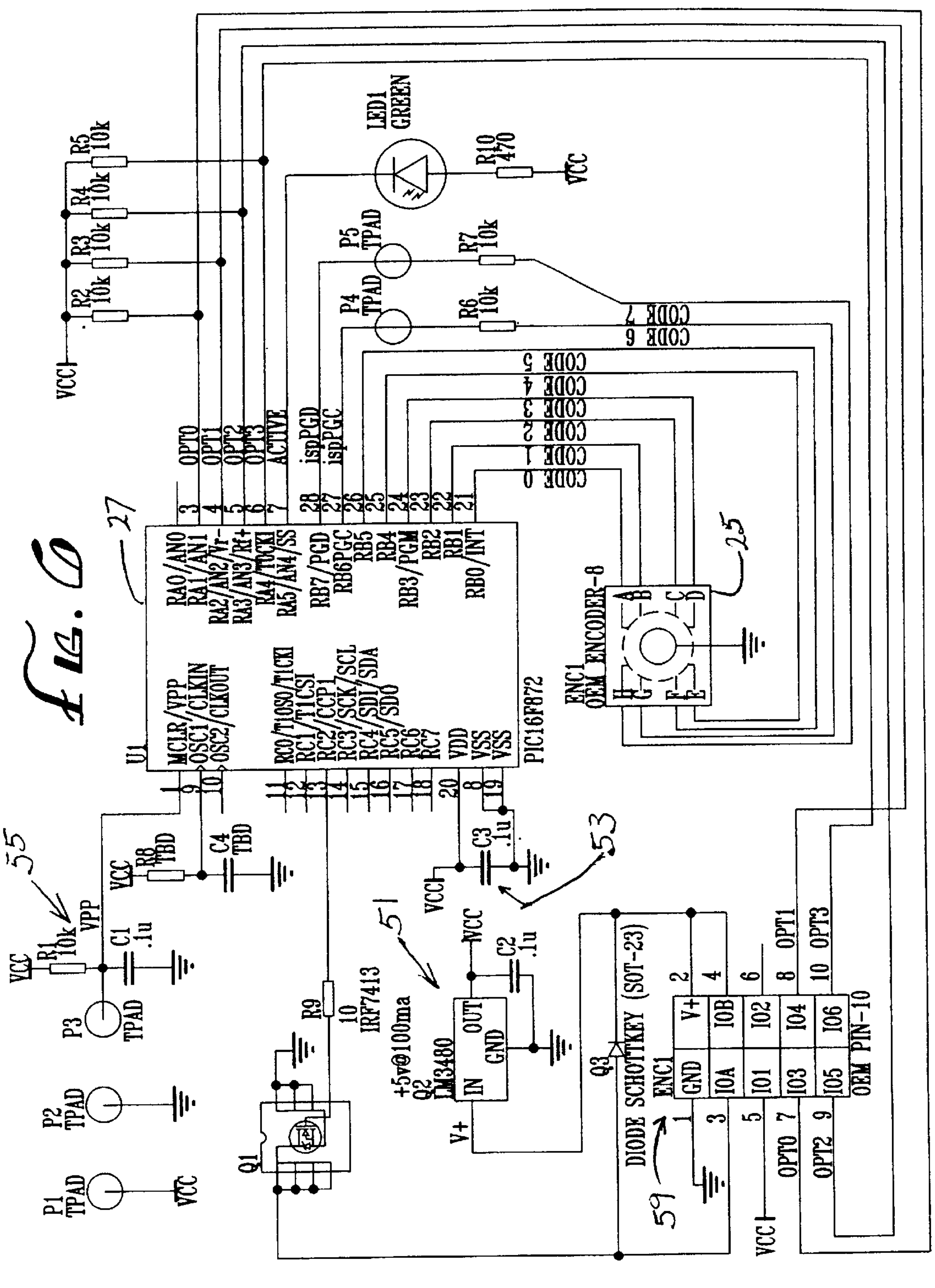
FIG. 6 is a schematic diagram of an electronic device embodying an integrated encoder in accordance with the present invention.
Figure 7:
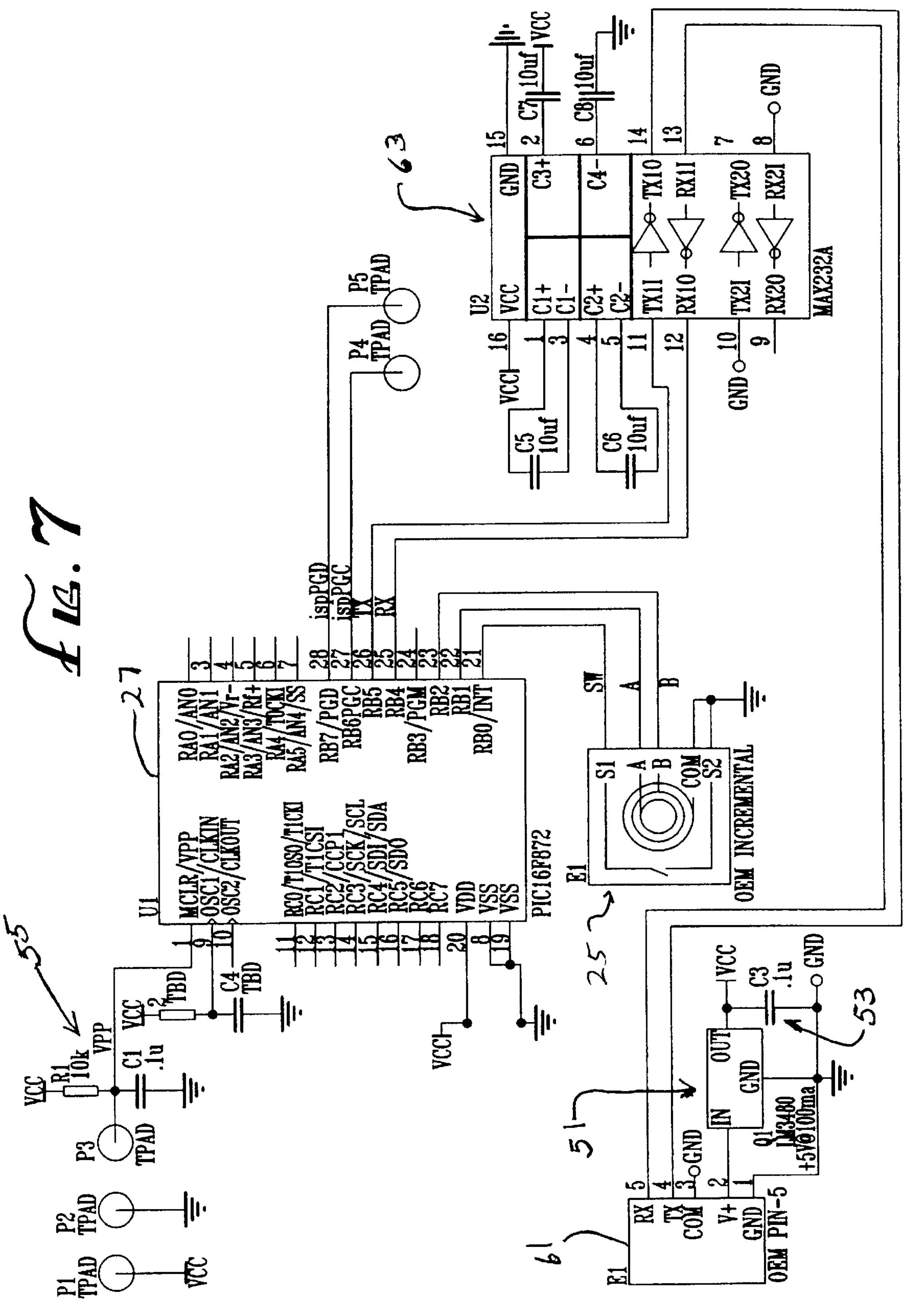
FIG. 7 is a schematic diagram of another electronic device embodying the integrated encoder in accordance with the present invention.

Two exemplary detailed specific implementations of the integrated encoder device 30 of the present invention are illustrated in the circuit diagrams of FIGS. 6 and 7 for particular applications.

The implementation illustrated in FIG. 6 is a motor controller pulse width modulator. The motor controller pulse width modulator implementation of FIG. 6 includes supervisory power supply protection that includes a power regulator 51, a power filter 53, and controller reset 55. A rotary digital encoder 25 provides input data to a programmable RISC-type microprocessor 27. The programmable microprocessor 27 is configured to apply signal conditioning and processing functions to the signals output from the encoder 25. The processed signals from the microprocessor are output to an output device Q1 and a motor interface element 59. A motor (not shown) may be attached to the interface element 59.

The encoder 25 is formed on one surface (such as the upper surface) of the circuit board 31 (FIG. 2), while the programmable microprocessor 27 and the other circuit elements are mounted on the other surface (such as the lower surface) of the circuit board. The connecting circuitry among the elements is formed on the surface of, or in intermediate layers of, the circuit board 31. Contact pads P1, P2, P3, P4, and P5 are connected to input and output pins, such as the input and output pins 47 of the embodiment illustrated in FIGS. 2–5. Persons familiar with the art will recognize that the voltage levels VCC and ground are distributed to the different circuit elements by electric traces on or in the circuit board, but not shown in FIG. 6.

As described above, the integrated device illustrated conceptually in FIG. 1 receives power through a power input 21. Supervisory power supply protection ensures that appropriate power levels are applied to the other elements of the device, removes high frequency noise from the source power, assists in mitigating short duration voltage spikes, and provides a controller reset function.

In the specific implementation illustrated in FIG. 6, V+ source power is supplied through the interface element 59. The source power may, for example, be an input voltage between +6 vdc and +30 vdc. An LM3480 power regulator 51 (or equivalent) converts the V+ source power to the TTL or CMOS level required by the other elements of the device. The power regulator 51 provides a stable, “clean” voltage Vcc. An LM3480 power regulator is available from many sources, including National Semiconductor Corp.

A power filter 53 in the supervisory power supply protection removes high frequency noise that may be present in the source power, or even from the output of the power regulator. The power filter 53 may also assist in protecting the electronic circuitry of the device from short duration voltage spikes that may be found in the source power used in certain applications, such as automotive and industrial applications. Capacitors may be used as the power filter. Referring, for example, to the specific implementation illustrated in FIG. 6, a capacitor C3 connected to the power input of the microprocessor functions as a power filter.

A control or reset element 55 provides the capability to ensure proper start-up of the logic and processor sections of the microprocessor. In the particular implementation illustrated in FIG. 6, the control or reset element 55 comprises an R-C network formed of a resistor R1 and a capacitor C1 connected to the MCLR/VPP input of the microprocessor 27, and connected to a touch or contact pad P3.

A digital encoder 25 provides signals responsive to the movement of the encoder shaft 33 (FIG. 2) to the microprocessor 27. The particular device illustrated in FIG. 6 incorporates an 8-bit gray code absolute encoder producing 8 signal lines. The encoder may, for example, be designed to be substantially identical to the ACE-128 contacting encoder manufactured and sold by Bourns, Inc. of Riverside, Calif. However, those skilled in the art will recognize that depending on the information required, different types of encoder designs may be incorporated into the integrated device 30.

The microprocessor 27 performs the signal processing functions programmed into it, producing an output on pin RC2/CCP1. The signal produced by the microprocessor proceeds to an output interface Q1, which in turn drives the output device 59. In the particular application illustrated in FIG. 6, a motor may be attached to pin 6 of the output device. The pin 6 of the output device may be connected through the circuit board 31 (FIG. 2) to one of the input and output pins 47 for external connection. A Schottky diode Q3 is included in the output circuitry for clamping the fly-back voltage, as will be understood by those skilled in the art. Together, the output interface Q1, the Schottky diode Q3, and the output device 59 form the output converter 29 shown in FIG. 1. The details of the input and output functions depend upon the application to which the device is being placed. Those skilled in the art will recognize the different types of devices that may be driven, and will recognize the manner in which the processed signals from the encoder may be applied to those different types of devices.

The implementation illustrated in FIG. 7 provides an external output of appropriately conditioned and processed signals at an industry standard asynchronous RS232C communication interface 63.

The implementation of FIG. 7 includes supervisory power supply protection that includes a power regulator 51, a power filter 53, and controller reset 55. A rotary digital encoder 25 provides input data for a programmable RISC-type microprocessor 27. The microprocessor 27 also receives power from the supervisory power supply protection elements 51, 55. The programmable microprocessor 27 is configured to provide signal conditioning and processing functions, which are output from the microprocessor to an RS232C communication interface output device (or the equivalent).

V+ source power is supplied from the interface, which in this particular embodiment is a charge pump 61 for an RS232C communication interface. An LM3480 power regulator 51 (or the equivalent) converts the V+ source power to the TTL or CMOS level required by the other elements of the device, and provides a stable, "clean" voltage Vcc.

The power filter of the supervisory power supply protection removes high frequency noise that may be present in the source power, or even from the output of the power regulator. The power filter may also assist in protecting the electronic circuitry of the device from short duration voltage spikes that may be found in the source power used in certain applications, such as automotive and industrial applications. A capacitor C3 connected to the output of the power regulator 51 functions as a power filter in this embodiment.

The control or reset element 55 provides the capability to ensure proper start-up of the logic and processor sections of the microprocessor. In the particular implementation illustrated in FIG. 7, the control or reset function element 55 comprises an R-C network formed of a resistor R1 and a capacitor C1 connected to the MCLR/VPP input of the microprocessor, and connected to a touch or contact pad P3.

A digital encoder 25 provides signals responsive to the movement of the encoder shaft 33 (FIG. 2) to the microprocessor 27. For example, the encoder of the implementation illustrated in FIG. 7 is an incremental encoder that may be substantially identical to the 2-bit gray code digital contacting encoders marketed by Bourns, Inc. of Riverside, Calif. However, those skilled in the art will recognize that depending on the information required from the encoder, different types of encoders design may be incorporated into the integrated device.

The microprocessor 27 performs the signal processing functions programmed into it, interfacing with the asynchronous RS232C communication interface 63 via pins RB4 and RB5. The details of the input and output functions depend upon the application to which the device is being placed. Those skilled in the art will recognize the different types of devices that may be driven from the RS232C communication interface, and will recognize the manner in which the processed signals from the encoder 25 may be applied to those different types of devices. In addition, those skilled in the art will recognize that different types of communication interface may be used in lieu of the RS232C interface.

Although the present invention has been described above in particular embodiments, it will be clear from the foregoing discussion that numerous variations and modifications will suggest themselves to those skilled in the pertinent arts. Such variations and modifications should be considered within the spirit and scope of the present invention, as defined in the claims that follow.

We claim:

1. An electronic device comprising:

an encoder for converting mechanical movement to a digital electrical signal, the encoder having an output terminal on which the digital electrical signal is produced;

a substrate having opposed first and second major surfaces, wherein the encoder is mounted on the first major surface of the substrate; and at least one programmable electronic device mounted on the second major surface of the substrate, wherein the at least one programmable electronic device comprises a signal processor that is configured for processing signals produced by the encoder and that is electrically connected to the output terminal of the encoder.

2. The electronic device of claim 1, wherein the programmable electronic device further comprises a programmable controller.

3. The electronic device of claim 2, wherein:

the programmable controller is programmed to process signals produced by the encoder; and the programmable controller is additionally programmed so that the electrical signals produced by the encoder can selectively alter the signal processing performed by the programmable controller.

4. The electronic device of claim 1, wherein the at least one electronic device comprises:

a programmable electronic device for performing signal processing functions; and a power regulator.

5. An integrated digital electronic encoder comprising:

a substrate having first and second substantially opposed major surfaces;

a digital encoder formed on the first major surface of the substrate, wherein the encoder comprises an actuation shaft, and wherein the encoder is configured to generate electrical signals in response to movement of the actuation shaft; and programmable electronic circuitry attached to the second major surface of the substrate, wherein the electronic circuitry is electrically connected with the digital encoder, and wherein the electronic circuitry comprises a signal processor configured for processing signals produced by the encoder.

6. The integrated digital electronic encoder of claim 5, wherein the encoder is configured to generated electrical signals in response to rotational and axial movement of the actuation shaft.

7. The integrated digital electronic encoder of claim 5, wherein the programmable electronic circuitry comprises a programmable controller.

8. The electronic device of claim 7, wherein:

the programmable controller is programmed to process signals produced by the encoder; and the programmable controller is additionally programmed so that the electrical signals produced by the encoder can selectively alter the signal processing performed by the programmable controller.

9. The integrated digital electronic encoder of claim 5, additionally comprising a housing enclosing the digital encoder.

10. An integrated digital electronic encoder comprising:

a substrate having first and second opposed major surfaces;

a digital encoder formed on the first major surface of the substrate, wherein the encoder is configured to generate electrical signals in response to movement of an input device; and electronic circuitry attached to the substrate, wherein the electronic circuitry comprises supervisory power processing circuitry, and a logic device for processing the electrical signals generated by the encoder, and wherein at least some of the electronic circuitry is attached to the second surface of the substrate.

11. The integrated digital electronic encoder of claim 10, wherein the supervisory power processing circuit comprises a power regulator and a power filter.

12. The integrated digital electronic encoder of claim 11, wherein the power filter comprises a capacitor.

13. The integrated digital electronic encoder of claim 10, wherein the logic device comprises a programmable logic device.

14. The integrated digital electronic encoder of claim 13, wherein the programmable logic device is programmed to perform signal processing functions on the electrical signals generated by the encoder.

15. The electronic device of claim 14, wherein:

the programmable logic device is programmed to process signals produced by the encoder; and the programmable logic device is additionally programmed so that the electrical signals produced by the encoder can selectively alter the signal processing performed by the programmable logic device.

16. The integrated digital electronic encoder of claim 15, wherein the electronic circuitry additionally comprises a communication interface circuit.

17. The integrated digital electronic encoder of claim 10, wherein the electronic circuitry is surface mounted on the second major surface of the substrate.

18. An integrated digital electronic encoder comprising:

a printed circuit board having first and second substantially opposed major surfaces;

a digital encoder formed on the first major surface of the substrate, the digital encoder comprising:

an actuation shaft having rotational and axial movement;

conductive elements formed on the first major surface of the printed circuit board for converting rotational and axial movement of the actuation shaft into electrical signals;

a programmable logic device surface mounted on the second major surface of the printed circuit board, wherein:

the programmable logic device is connected through the printed circuit board to the digital encoder to receive the electrical signals generated by the digital encoder;

the programmable logic device is programmed to process the electrical signals generated by the digital encoder; and supervisory power processing circuitry attached to the second major surface of the printed circuit board for conditioning power applied to the programmable logic device; and a communication interface circuit attached to the second major surface of the printed circuit board for receiving from the programmable logic device processed signals.

19. The electronic device of claim 18, wherein:

the programmable logic device is programmed to process signals produced by the encoder; and the programmable logic device is additionally programmed so that the electrical signals produced by the encoder can selectively alter the signal processing performed by the programmable logic device.

20. An integrated digital electronic encoder comprising:

a substrate having first and second substantially opposed major surfaces;

a digital encoder formed on the first major surface of the substrate, wherein the encoder comprises an actuation shaft, and wherein the encoder is configured to generate electrical signals in response to movement of the actuation shaft; and programmable electronic circuitry attached to the second major surface of the substrate, wherein the electronic circuitry includes (a) circuitry for processing the electrical signals generated by the digital encoder, and (b) supervisory power circuitry.

21. The integrated digital electronic encoder of claim 20, wherein the electronic circuitry additionally comprises a communication interface circuit.

22. An electronic device comprising:

an encoder for converting mechanical movement to a digital electrical signal, the encoder having an output terminal on which the digital electrical signal is produced;

a substrate having opposed first and second major surfaces, wherein the encoder is mounted on the first major surface of the substrate; and at least one programmable electronic device mounted on the second major surface of the substrate, wherein the at least one programmable electronic device is electrically connected to the output terminal of the encoder; and wherein the at least one electronic device comprises a programmable electronic device for performing signal processing functions and a power regulator.

* * * * *